US012562216B2

(12) United States Patent
Lo et al.

(10) Patent No.: US 12,562,216 B2
(45) Date of Patent: Feb. 24, 2026

(54) CIRCUIT WITH SWEPT VOLTAGE ON BIT LINE OR BIT LINE BAR

(71) Applicant: Taiwan Semiconductor Manufacturing Company, Ltd., Hsinchu (TW)

(72) Inventors: Chi Lo, Hsinchu (TW); Chia-En Huang, Hsinchu (TW); Yi-Ching Liu, Hsinchu (TW); Hiroki Noguchi, Hsinchu (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 251 days.

(21) Appl. No.: 18/460,155

(22) Filed: Sep. 1, 2023

(65) Prior Publication Data

US 2025/0078907 A1     Mar. 6, 2025

(51) Int. Cl.
| | |
|---|---|
| *G11C 7/06* | (2006.01) |
| *G11C 11/408* | (2006.01) |
| *G11C 11/4091* | (2006.01) |
| *G11C 11/4094* | (2006.01) |
| *G11C 29/02* | (2006.01) |
| *G11C 29/12* | (2006.01) |
| *G11C 29/50* | (2006.01) |

(52) U.S. Cl.
CPC ...... *G11C 11/4091* (2013.01); *G11C 11/4085* (2013.01); *G11C 11/4094* (2013.01); *G11C 29/026* (2013.01); *G11C 29/12005* (2013.01); *G11C 2029/1204* (2013.01); *G11C 29/50* (2013.01)

(58) Field of Classification Search
CPC ............ G11C 11/4091; G11C 11/4085; G11C 11/4094; G11C 29/50; G11C 11/4078; G11C 29/025; G11C 29/026; G11C 29/12005; G11C 2029/1204; G11C 2029/5006
See application file for complete search history.

(56) References Cited

U.S. PATENT DOCUMENTS

| | | | | |
|---|---|---|---|---|
| 6,067,256 A | * | 5/2000 | Yamashita | ............ G11C 11/419 365/189.08 |
| 2004/0105334 A1 | * | 6/2004 | Yasuda | .................. G11C 29/02 365/205 |

(Continued)

*Primary Examiner* — Mushfique Siddique
(74) *Attorney, Agent, or Firm* — Merchant & Gould P.C.

(57) ABSTRACT

An integrated circuit includes a sense amplifier connected to a bit line and a bit line bar, a first memory cell configured to store a data signal and selectively output the data signal on at least one of the bit line and the bit line bar in response to a word line signal, a first circuit connected between a first voltage terminal configured to receive a first external voltage and the bit line and having a first enable terminal configured to receive a first enable signal, wherein the first external voltage is different than the data signal, and a second circuit connected between a second voltage terminal configured to receive a second external voltage and the bit line bar and having a second enable terminal configured to receive a second enable signal, wherein the second external voltage is different than the data signal and the first external voltage.

20 Claims, 13 Drawing Sheets

(56) References Cited

U.S. PATENT DOCUMENTS

| | | | |
|---|---|---|---|
| 2004/0204891 A1* | 10/2004 | Horihata ............. | G11C 11/4094 |
| | | | 702/117 |
| 2006/0256625 A1* | 11/2006 | Kajitani ................... | G11C 7/08 |
| | | | 365/210.13 |
| 2008/0081457 A1 | 4/2008 | Lin et al. | |
| 2013/0127024 A1 | 5/2013 | Lin et al. | |
| 2014/0204659 A1* | 7/2014 | Singh ..................... | G11C 7/065 |
| | | | 365/156 |
| 2018/0061461 A1* | 3/2018 | Seo .......................... | G11C 7/18 |
| 2023/0023505 A1* | 1/2023 | Lee ......................... | G11C 7/067 |
| 2023/0238052 A1* | 7/2023 | Shang ..................... | G11C 7/12 |
| | | | 365/149 |
| 2024/0339151 A1* | 10/2024 | Lee ..................... | G11C 11/4094 |

* cited by examiner

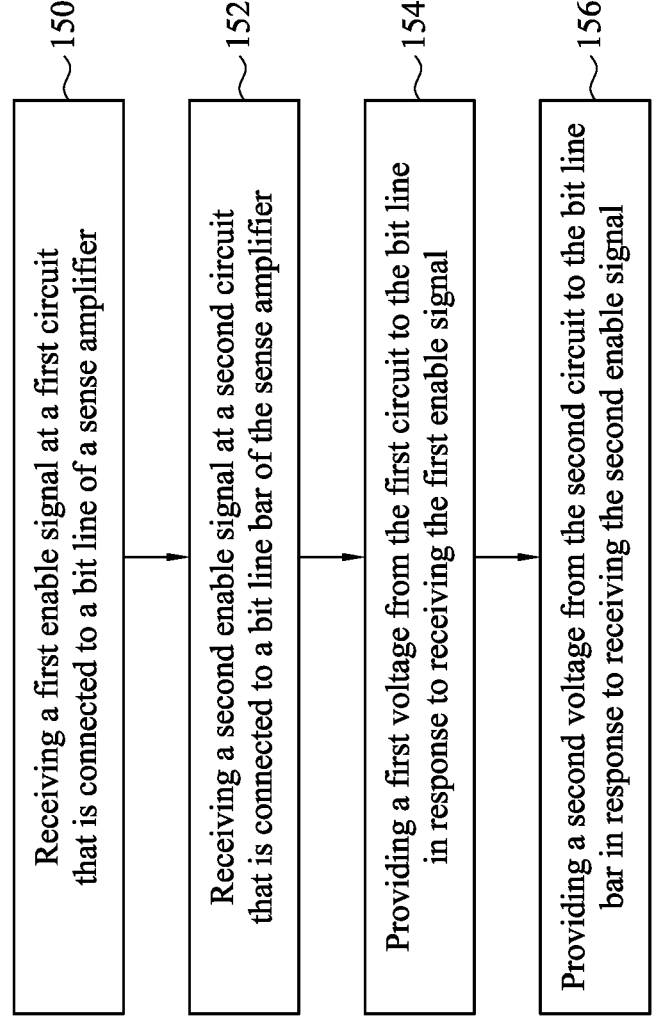

150

Receiving a first enable signal at a first circuit that is connected to a bit line of a sense amplifier

152

Receiving a second enable signal at a second circuit that is connected to a bit line bar of the sense amplifier

154

Providing a first voltage from the first circuit to the bit line in response to receiving the first enable signal

156

Providing a second voltage from the second circuit to the bit line bar in response to receiving the second enable signal

Fig. 14

CIRCUIT WITH SWEPT VOLTAGE ON BIT LINE OR BIT LINE BAR

BACKGROUND

Typically, electronic systems store data in memory devices, such as dynamic random-access memory (DRAM) devices. Often, the DRAM is the primary storage medium of the system due to the relatively fast access times of the DRAM. One type of DRAM includes one transistor one capacitor (1T1C) memory cells that each store one bit of data. The transistor is an access control transistor situated between the capacitor and a bit line (BL) or a bit line bar (BLB) of a sense amplifier (SA). The access control transistor is activated to read data from or write data to the capacitor.

During standby mode, a DRAM provides an equalized pre-charge voltage to the BL and the BLB of the SA. When reading data from a memory cell, a selected word line activates a selected access control transistor, such that the data voltage on the corresponding capacitor is transferred to one of the BL and the BLB. The other one of the BL and the BLB provides the equalized pre-charge voltage as a reference voltage. In this configuration, it is difficult to check SA functionality without using data from a memory cell. Also, it is difficult to determine offset voltages of the SA and sensing margins of the SA, since both the BL and the BLB are charged to the same voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

FIG. 14 is a diagram schematically illustrating a method of operating a semiconductor device, such as the sensing circuit, in accordance with some embodiments.

DETAILED DESCRIPTION

Figure 1:
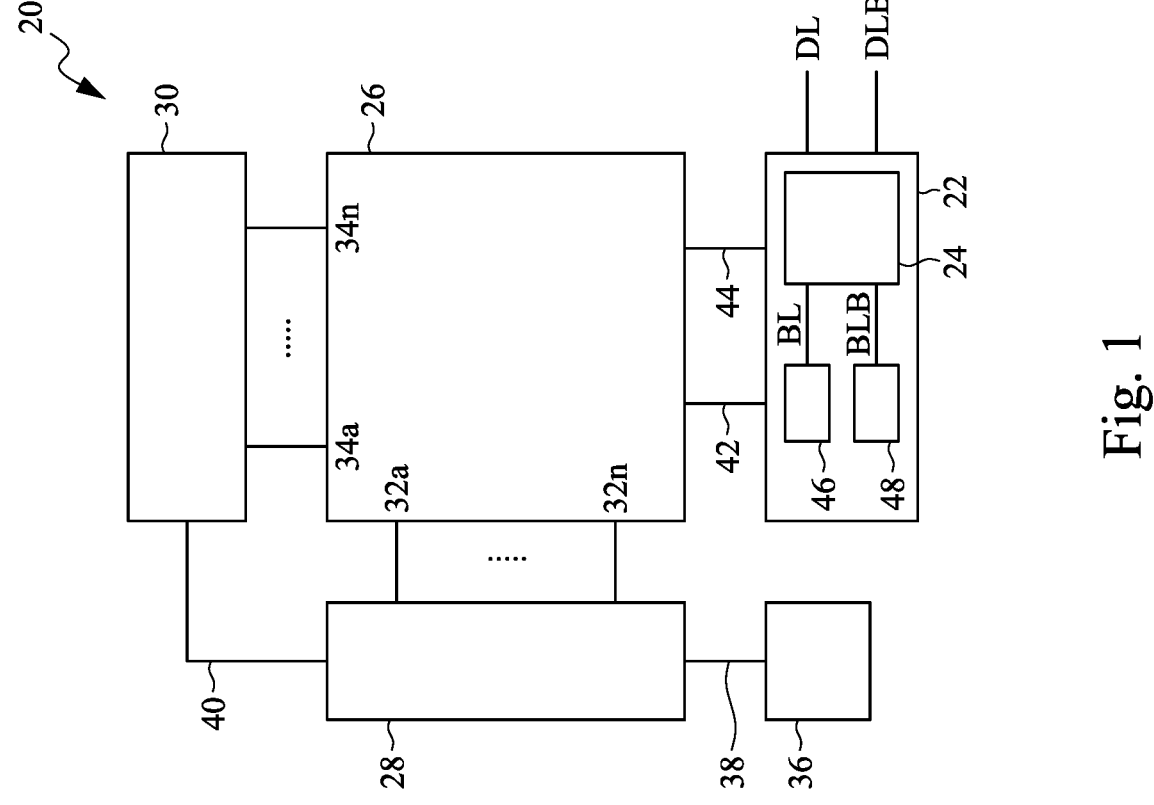
FIG. 1 is a diagram schematically illustrating a semiconductor device that includes a sensing circuit configured to provide different voltages to a BL and a BLB of a SA, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments provide an integrated circuit that includes a SA having a BL and a BLB, a first charging circuit connected to the BL, and a second charging circuit connected to the BLB. The first charging circuit receives one or more enable signals and provides a first voltage to the BL in response to the one or more enable signals and the second charging circuit receives one or more enable signals and provides a second voltage to the BLB in response to the one or more enable signals. The first charging circuit and the second charging circuit can provide different voltages to the BL and the BLB.

Disclosed embodiments further provide that at least one of the first charging circuit and the second charging circuit is an n type pass gate, a p type pass gate, a CMOS pass gate, a multiplexer, or includes decoder gating.

Advantages of the integrated circuit include testing functionality of the SA without using a memory cell; determining offset of the SA; determining sensing margin of the SA; and measuring leakage currents of the BL, the BLB, and the storage node, such as the storage node capacitor.

FIG. 1 is a diagram schematically illustrating a semiconductor device 20 that includes a sensing circuit 22 configured to provide different voltages to a BL and a BLB of a SA 24, in accordance with some embodiments. The semiconductor device 20 includes a memory device. In some embodiments, the semiconductor device 20 includes a DRAM. In some embodiments, the semiconductor device 20 includes a 1T1C memory array. In some embodiments, the semiconductor device 20 is an integrated circuit.

The semiconductor device 20 includes a memory array 26, a row decoder circuit 28, and a column decoder circuit 30. The memory array 26 includes memory cells, such as 1T1C memory cells, arranged in an x-y grid. The row decoder circuit 28 is electrically connected to the memory array 26 by row lines 32a-32n that extend in the x-direction. The column decoder circuit 30 is electrically connected to the memory array 26 by column lines 34a-34n that extend in the y-direction. The rows extend along the x-axis and the columns extend along the y-axis of the x-y grid of the memory array 26.

The semiconductor device 20 includes a control circuit 36 that is electrically connected to the row decoder circuit 28 and the column decoder circuit 30 by conductive paths 38 and 40. The row decoder circuit 28 receives and decodes row addresses and the column decoder circuit 30 receives and decodes column addresses. Also, the row decoder circuit 28 and the column decoder circuit 30 receive instructions from the control circuit 36 to control operation of the semiconductor device 20.

The sensing circuit 22 is electrically connected to the memory array 26 by memory array conductive paths 42 and 44. The sensing circuit 22 includes the SA 24 that includes the BL and the BLB, a first charging circuit 46 that is electrically connected to the BL, and a second charging circuit 48 that is electrically connected to the BLB. The first charging circuit 46 receives one or more enable signals and provides a first voltage to the BL in response to the one or more enable signals and the second charging circuit 48 receives one or more enable signals and provides a second voltage to the BLB in response to the one or more enable signals. The first charging circuit 46 and the second charging circuit 48 can provide different voltages to the BL and the BLB. The sensing circuit 22 provides and receives data through data line (DL) and data line bar (DLB).

Figure 2:
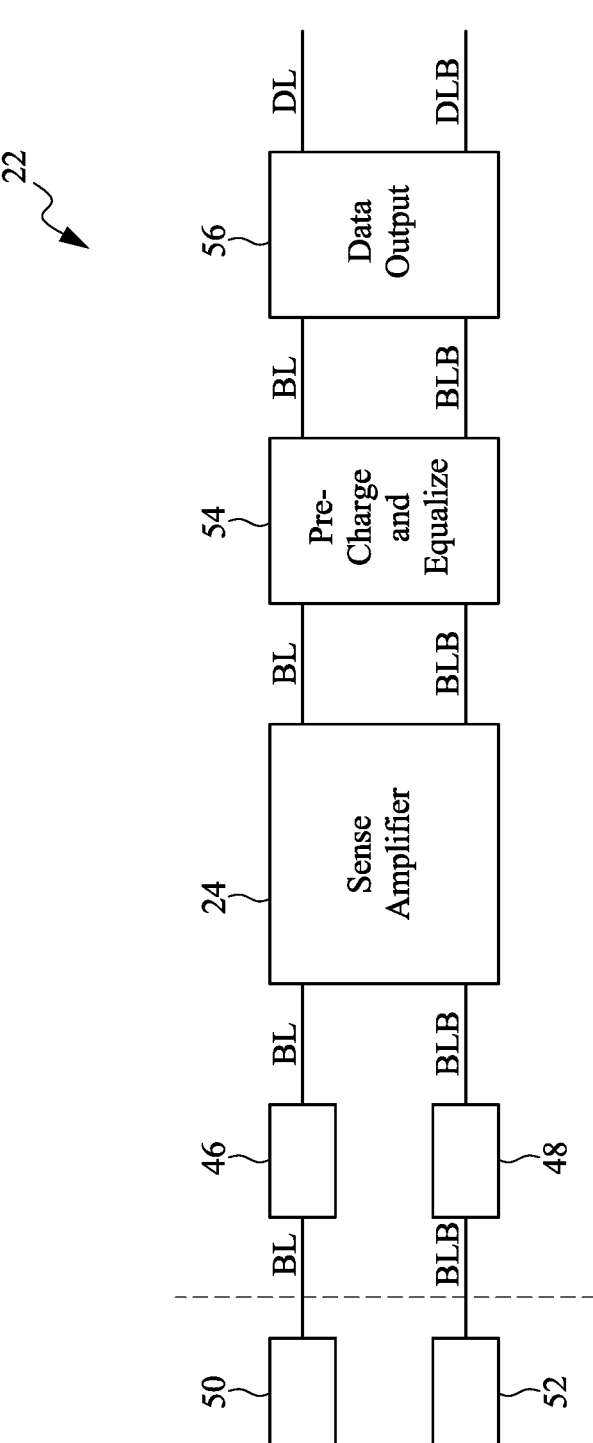
FIG. 2 is a diagram schematically illustrating the sensing circuit connected to a first memory cell and a second memory cell, in accordance with some embodiments.

FIG. 2 is a diagram schematically illustrating the sensing circuit 22 connected to a first memory cell 50 and a second memory cell 52, in accordance with some embodiments. The sensing circuit 22 includes the SA 24, the first charging circuit 46, the second charging circuit 48, a pre-charge and equalize circuit 54, and a data output circuit 56.

The first memory cell 50 is electrically connected to the first charging circuit 46 and the SA 24 by the BL, and the second memory cell 52 is electrically connected to the second charging circuit 48 and the SA 24 by the BLB. The SA 24 is further electrically connected to the pre-charge and equalize circuit 54 and to the data output circuit 56 by the BL and the BLB. In some embodiments, at least one of the first memory cell 50 and the second memory cell 52 is a 1T1C memory cell.

In reading data from one of the first memory cell 50 and the second memory cell 52, such as the first memory cell 50, the pre-charge and equalize circuit 54 is enabled to provide an equalized bit line voltage VBLEQ to each of the BL and the BLB. Next, the first memory cell 50 is connected to the BL, such that stored data in the first memory cell 50 raises or lowers the voltage on the BL in relation to the BLB. The SA 24 detects the difference and latches in the data from first memory cell 50. The data output circuit 56 outputs the data to the DL and the DLB. Neither the first charging circuit 46 nor the second charging circuit 48 is activated to read data from one of the first memory cell 50 and the second memory cell 52.

In writing data to the first memory cell 50 and the second memory cell 52, data can be provided to the BL and the BLB via the data output circuit 56 and latched into the SA 24. The latched-in data is provided to the first memory cell 50 or the second memory cell 52 and stored in the selected memory cell. Neither the first charging circuit 46 nor the second charging circuit 48 is activated to write data into one of the first memory cell 50 and the second memory cell 52.

In operations of the first charging circuit 46 and the second charging circuit 48, the first charging circuit 46 receives one or more enable signals and provides a first voltage to the BL in response to the one or more enable signals. Also, the second charging circuit 48 receives one or more enable signals and provides a second voltage to the BLB in response to the one or more enable signals. The first charging circuit 46 and the second charging circuit 48 can provide different voltages to the BL and the BLB.

In addition, the first charging circuit 46 and the second charging circuit 48 can provide voltages on the BL and the BLB to test functionality of the SA 24 without using data from a memory cell; determine an offset of the SA 24; determine a sensing margin of the SA 24; and measure leakage currents of the BL, the BLB, and the storage nodes of the first memory cell 50 and the second memory cell 52.

Figure 3:
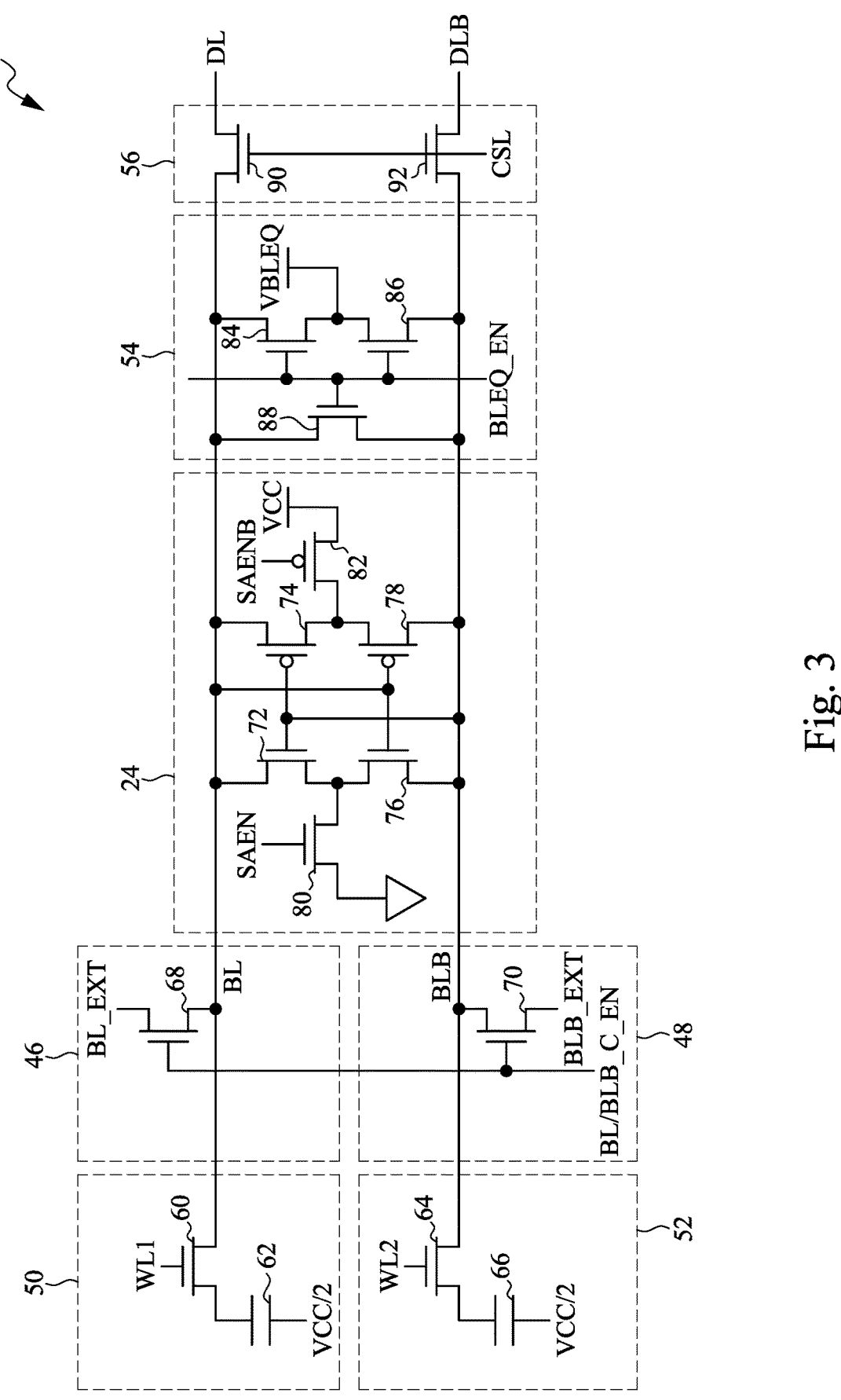
FIG. 3 is a diagram schematically illustrating an example of the sensing circuit, the first memory cell, and the second memory cell, according to some embodiments.

FIG. 3 is a diagram schematically illustrating an example of the sensing circuit 22, the first memory cell 50, and the second memory cell 52, according to some embodiments. The sensing circuit 22 includes the SA 24, the first charging circuit 46, the second charging circuit 48, the pre-charge and equalize circuit 54, and the data output circuit 56.

The first memory cell 50 is a 1T1C memory cell that includes a first NMOS access control transistor 60 and a first storage capacitor 62. One end of the drain/source path of the first NMOS access control transistor 60 is electrically connected to the BL of the sensing circuit 22 and the other end is electrically connected to one end of the first storage capacitor 62. The other end of the first storage capacitor 62 is connected to receive a memory cell reference voltage of VCC/2. The gate of the first NMOS access control transistor 60 receives word line signal WL1.

The second memory cell 52 is a 1T1C memory cell that includes a second NMOS access control transistor 64 and a second storage capacitor 66. One end of the drain/source path of the second NMOS access control transistor 64 is electrically connected to the BLB of the sensing circuit 22 and the other end is electrically connected to one end of the second storage capacitor 66. The other end of the second storage capacitor 66 is connected to receive the memory cell reference voltage of VCC/2. The gate of the second NMOS access control transistor 64 receives word line signal WL2.

The first memory cell 50 is electrically connected to the first charging circuit 46 by the BL. The first charging circuit 46 includes a first NMOS pass gate transistor 68. One end of the drain/source path of the first NMOS pass gate transistor 68 receives external bit line voltage BL_EXT and the other end is electrically connected to the BL. The gate of the first NMOS pass gate transistor 68 receives a charge enable signal BL/BLB_C_EN.

The second memory cell 52 is electrically connected to the second charging circuit 48 by the BLB. The second charging circuit 48 includes a second NMOS pass gate transistor 70. One end of the drain/source path of the second NMOS pass gate transistor 70 receives external bit line bar voltage BLB_EXT and the other end is electrically connected to the BLB. The gate of the second NMOS pass gate transistor 70 receives the charge enable signal BL/BLB_C_EN. In other embodiments, the first charging circuit 46 and the second charging circuit 48 receive enable signals that are not the same.

The SA 24 includes a first NMOS SA transistor 72 and a first PMOS SA transistor 74 in a first cross-coupled inverter and a second NMOS SA transistor 76 and a second PMOS SA transistor 78 in a second cross-coupled inverter. The drain/source path of the first NMOS SA transistor 72 is electrically coupled at one end to the BL and at another end to the drain/source path of the second NMOS SA transistor 76 and to the drain/source path of an NMOS SA enable transistor 80. The other end of the drain/source path of the second NMOS SA transistor 76 is electrically connected to BLB and the other end of the drain/source path of the NMOS SA enable transistor 80 is electrically connected to a reference, such as ground. The drain/source path of the first PMOS SA transistor 74 is electrically coupled at one end to the BL and at the other end to the drain/source path of the second PMOS SA transistor 78 and to the drain/source path of a PMOS SA enable transistor 82. The other end of the drain/source path of the second PMOS SA transistor 78 is electrically connected to BLB and the other end of the drain/source path of the PMOS SA enable transistor 82 is electrically connected to power, such as VCC. The gates of the first NMOS SA transistor 72 and the first PMOS SA transistor 74 are connected to the BLB, and the gates of the second NMOS SA transistor 76 and the second PMOS SA transistor 78 are connected to the BL. Also, the gate of the NMOS SA enable transistor 80 receives a SA enable signal SAEN and the gate of the PMOS SA enable transistor 82 receives a SA enable bar signal SAENB.

The pre-charge and equalize circuit 54 includes a first NMOS pre-charge transistor 84, a second NMOS pre-charge transistor 86, and an NMOS equalize transistor 88. The drain/source path of the first NMOS pre-charge transistor 84 is electrically coupled at one end to the BL and at another end to the drain/source path of the second NMOS pre-charge transistor 86 and to receive the bit line equalize voltage VBLEQ. The other end of the drain/source path of the second NMOS pre-charge transistor 86 is electrically connected to BLB. The drain/source path of the NMOS equalize transistor 88 is electrically coupled at one end to the BL and at another end to the BLB. The gates of the first NMOS pre-charge transistor 84, the second NMOS pre-charge transistor 86, and the NMOS equalize transistor 88 are connected to receive the bit line equalize enable signal BLEQ_EN.

The data output circuit 56 includes a first NMOS output transistor 90 and a second NMOS output transistor 92. One side of the drain/source path of the first NMOS output transistor 90 is electrically connected to BL and the other end is electrically connected to DL. Also, one end of the drain/source path of the second NMOS transistor 92 is electrically connected to BLB and the other end is electrically connected to DLB. The gates of the first and second NMOS output transistors 90 and 92 are electrically connected to receive column select line signal CSL.

In reading data from one of the first memory cell 50 and the second memory cell 52, such as the first memory cell 50, the pre-charge and equalize circuit 54 receives an active high bit line equalize enable signal BLEQ_EN that biases on the first NMOS pre-charge transistor 84 and the second NMOS pre-charge transistor 86 to provide the bit line equalized voltage VBLEQ to the BL and the BLB. Also, the NMOS equalize transistor 88 is biased on to equalize the voltages on the BL and the BLB.

Next, the bit line equalize enable signal BLEQ_EN is set low to bias off the first NMOS pre-charge transistor 84, the second NMOS pre-charge transistor 86, and the NMOS equalize transistor 88. The word line signal WL1 is set to a high voltage to bias on the first NMOS access control transistor 60, which connects the first storage capacitor 62 to the BL and transfers the voltage stored on the first storage capacitor 62 to the BL, such as a voltage higher than VCC/2 if the data is a one and a voltage lower than VCC/2 if the data is zero. This raises or lowers the voltage on the BL in relation to the BLB that is at the bit line equalized voltage VBLEQ. The SA 24 detects the different voltages on the BL and the BLB and latches in the data via the cross-coupled inverters and the SA enable signal SAEN and SA enable bar signal SAENB. The data output circuit 56 receives an active high column select line signal CSL that biases on the first and second NMOS output transistors 90 and 92 and outputs the data on DL and DLB. Neither the first charging circuit 46 nor the second charging circuit 48 is activated to read data from one of the first memory cell 50 and the second memory cell 52.

In writing data to the first memory cell 50 and the second memory cell 52, the data output circuit 56 receives an active high column select line signal CSL that biases on the first and second NMOS output transistors 90 and 92, such that data on DL and DLB is transferred to BL and BLB, respectively, and latched into the SA 24. The word line signal WL1 or the word line signal WL2 is set high to access the first memory cell 50 or the second memory cell 52 and the data is stored on the storage capacitor of the selected memory cell. Neither the first charging circuit 46 nor the second charging circuit 48 is activated to write data into one of the first memory cell 50 and the second memory cell 52.

In operations of the first charging circuit 46 and the second charging circuit 48, the first charging circuit 46 receives an active high charge enable signal BL/BLB_C_EN that biases on the first NMOS pass gate transistor 68 and provides the external bit line voltage BL_EXT to the BL, and the second charging circuit 48 receives the active high charge enable signal BL/BLB_C_EN that biases on the second NMOS pass gate transistor 70 and provides the external bit line bar voltage BLB_EXT to the BLB. As described below, to provide different functions, the first charging circuit 46 and the second charging circuit 48 provide different voltages, including voltage sweeps, to the BL and/or the BLB.

The first charging circuit 46 and the second charging circuit 48 provide voltages on the BL and the BLB to test functionality of the SA 24 without using data from a memory cell; to determine an offset of the SA 24; to determine sensing margins of the SA 24; and to measure leakage currents of the BL, the BLB, and the storage capacitors of the first memory cell 50 and the second memory cell 52.

In this example, the first and second charging circuits 46 and 48 include n-type pass gates, i.e., NMOS transistors. In other embodiments, at least one of the first charging circuit 46 and the second charging circuit 48 can include a different type of pass gate, such as a p-type pass gate. In some embodiments, at least one of the first charging circuit 46 and the second charging circuit 48 includes a CMOS pass gate. In some embodiments, at least one of the first charging circuit 46 and the second charging circuit 48 includes a multiplexer. In some embodiments, at least one of the first charging circuit 46 and the second charging circuit 48 includes X or Y decoded gating.

Figure 4:
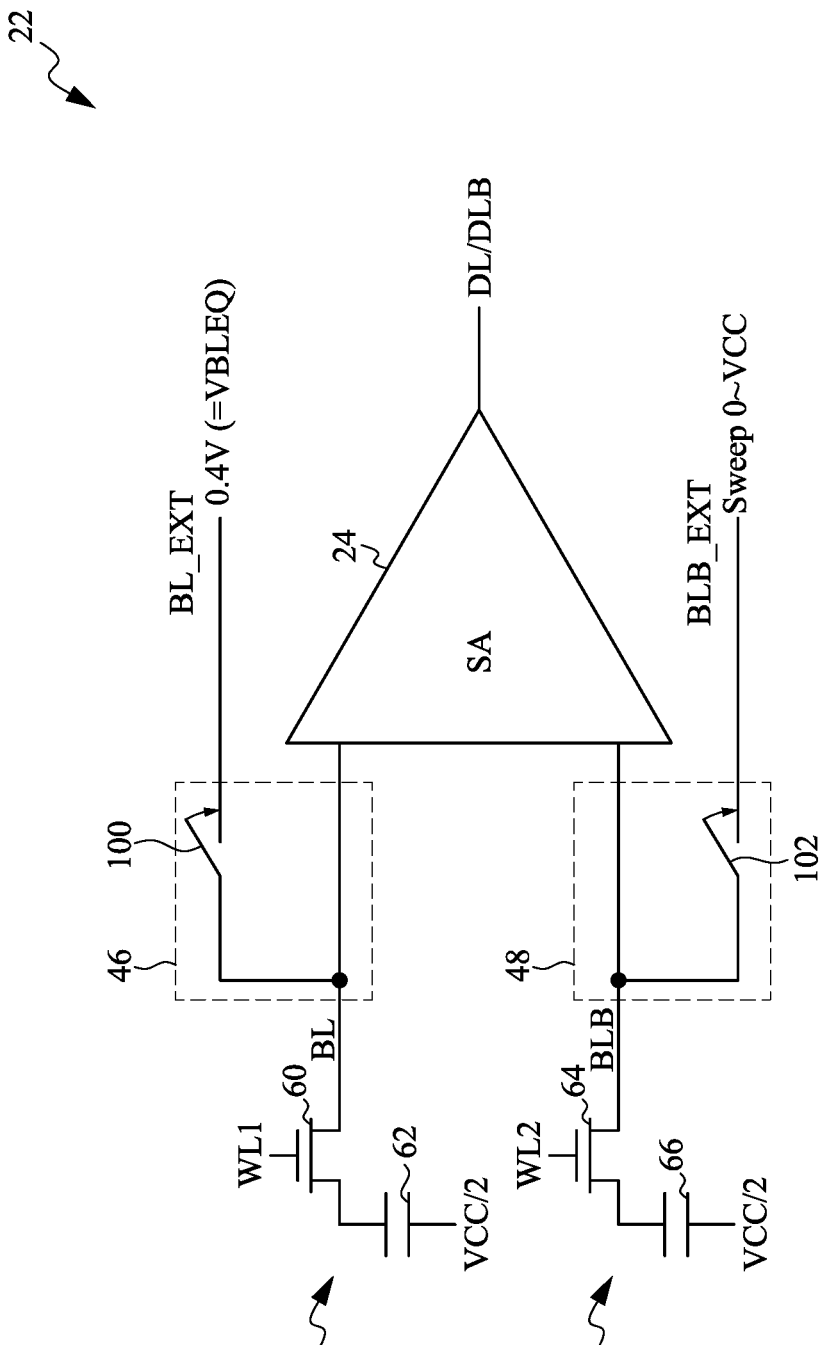
FIG. 4 is a diagram schematically illustrating the first memory cell, the second memory cell, and the sensing circuit configured for testing the SA, in accordance with some embodiments.

FIG. 4 is a diagram schematically illustrating the first memory cell 50, the second memory cell 52, and the sensing circuit 22 configured for testing the SA 24, in accordance with some embodiments. The first memory cell 50, the second memory cell 52, and the sensing circuit 22 are configured to test the functionality of the SA 24 without using data from one of the first and second memory cells 50 and 52 and to determine one or more offset voltages of the SA 24.

The first memory cell 50 is the 1T1C memory cell that includes the first NMOS access control transistor 60 and the first storage capacitor 62. The second memory cell 52 is the 1T1C memory cell that includes the second NMOS access control transistor 64 and the second storage capacitor 66. The gate of the first NMOS access control transistor 60 receives word line signal WL1, and the gate of the second NMOS access control transistor 64 receives word line signal WL2.

The first memory cell 50 is electrically connected to the first charging circuit 46 by the BL. The first charging circuit 46 includes a first switch or pass gate 100 connected at one end to the BL and at another end to receive the external bit line voltage BL_EXT.

The second memory cell 52 is electrically connected to the second charging circuit 48 by the BLB. The second charging circuit 48 includes a second switch or pass gate 102 connected at one end to the BLB and at another end to receive the external bit line bar voltage BLB_EXT.

To test the functionality of the SA 24 without using data from one of the first and second memory cells 50 and 52 and to determine one or more offset voltages of the SA 24, each of the word line signals WL1 and WL2 is set to a low voltage to bias off the first and second access control transistors 60 and 64, which disconnects the first and second storage capacitors 62 and 66 from the BL and the BLB, respectively. The external bit line voltage BL_EXT is set to the pre-charge voltage of VBLEQ, such as 0.4 volts, and the first switch 100 is closed to provide the pre-charge voltage of VBLEQ to the BL. Next, the second switch 102 is closed and the external bit line bar voltage BLB_EXT is swept from 0 volts to VCC.

If the SA 24 is functioning correctly, the SA 24 switches from a high output voltage DL and a low output voltage DLB to a low output voltage DL and a high output voltage DLB as the voltage on the BLB matches and sweeps higher than the pre-charge voltage of VBLEQ, such as 0.4 volts, on the BL. Also, an offset voltage of the SA 24 is determined from the difference in the BL and BLB voltages when the SA 24 switches states. In other embodiments, the external bit line bar voltage BLB_EXT can be swept from VCC to 0 volts.

Figures 5, 6:
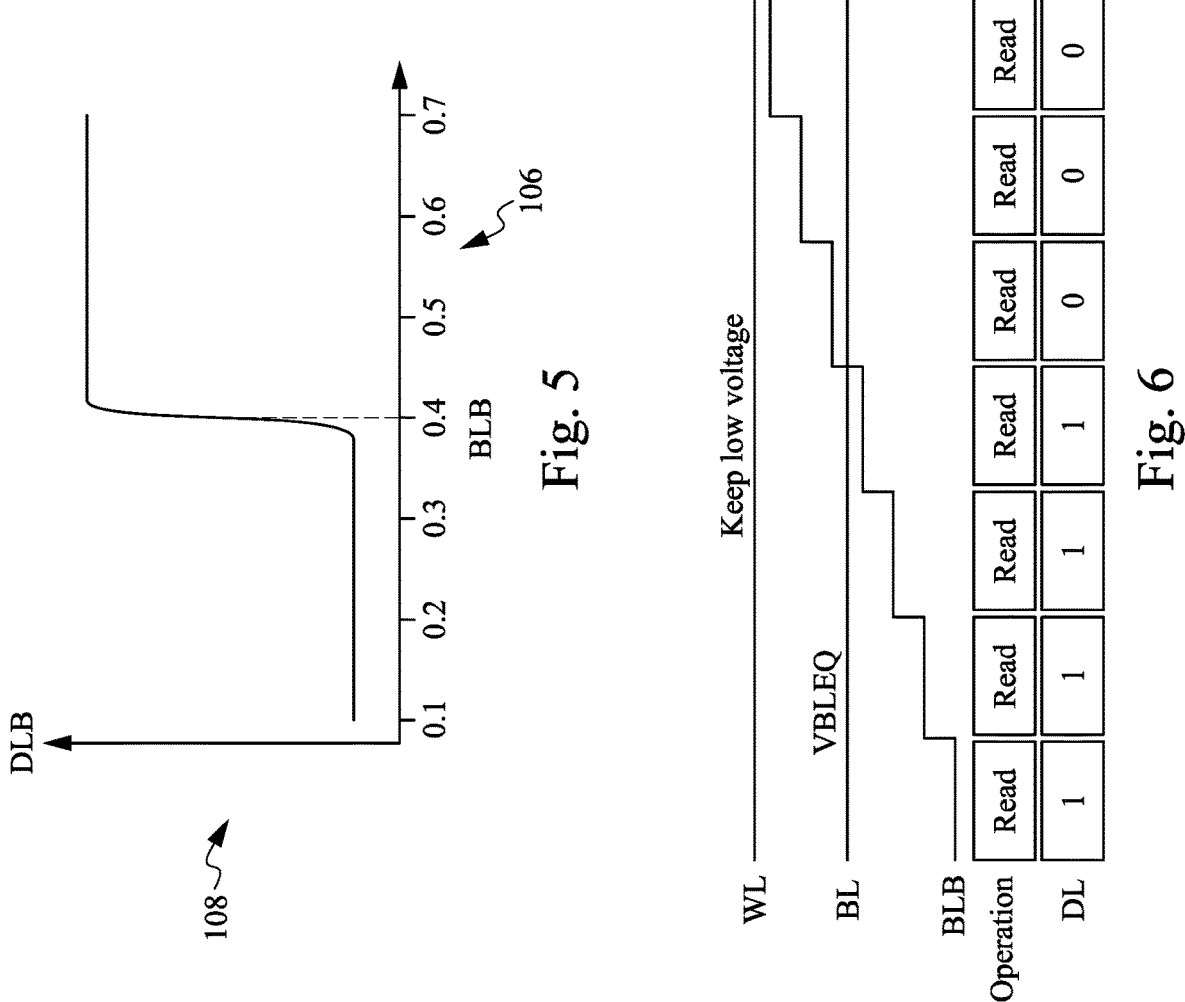
FIG. 5 is a diagram schematically illustrating the output voltage DLB versus the BLB voltage for the test configuration of the sensing circuit of FIG. 4, in accordance with some embodiments.
FIG. 6 is a diagram schematically illustrating operation of the test configuration of the sensing circuit of FIG. 4, in accordance with some embodiments.

FIG. 5 is a diagram schematically illustrating the output voltage DLB versus the BLB voltage for the test configuration of the sensing circuit 22 of FIG. 4, in accordance with some embodiments. The BLB voltage is on the x-axis 106 and the output voltage DLB is on the y-axis 108.

In this example, the BL has a pre-charge voltage of 0.4 volts and the BLB voltage is swept from 0.1 volts to 0.7 volts. With the BLB voltage less than 0.4 volts, the output voltage DLB is at a low voltage. The output voltage DLB begins to rise as the BLB voltage approaches the 0.4 volts on the BL. As the BLB voltage matches and sweeps higher than the BL voltage of 0.4 volts, the SA 24 changes state and the output voltage DLB rises to a high voltage. Thus, the SA 24 is functioning correctly.

FIG. 6 is a diagram schematically illustrating operation of the test configuration of the sensing circuit 22 of FIG. 4, in accordance with some embodiments. Each of the word line signals WL, including each of the word line signals WL1 and WL2, is set to a low voltage to bias off the first and second access control transistors 60 and 64, which disconnects the first and second storage capacitors 62 and 64 from the BL and the BLB, respectively. The BL is set to the bit line equalize voltage VBLEQ, such as 0.4 volts, and the first switch 100 is closed to provide the bit line equalize voltage VBLEQ to the BL. Next, the second switch 102 is closed and the BLB voltage is incrementally increased from a low voltage that is below the bit line equalize voltage VBLEQ, such as 0.1 volts, to a high voltage that is above the bit line equalize voltage VBLEQ, such as 0.7 volts.

As the BLB voltage is incrementally increased to the higher voltage, operation of the SA 24 provides an output voltage DL that is a one (high) if the BLB voltage is less than the BL voltage and a zero (low) if the BLB voltage is greater than the BL voltage. The offset of the SA 24 is determined by incrementing the BLB voltage.

Figure 7:
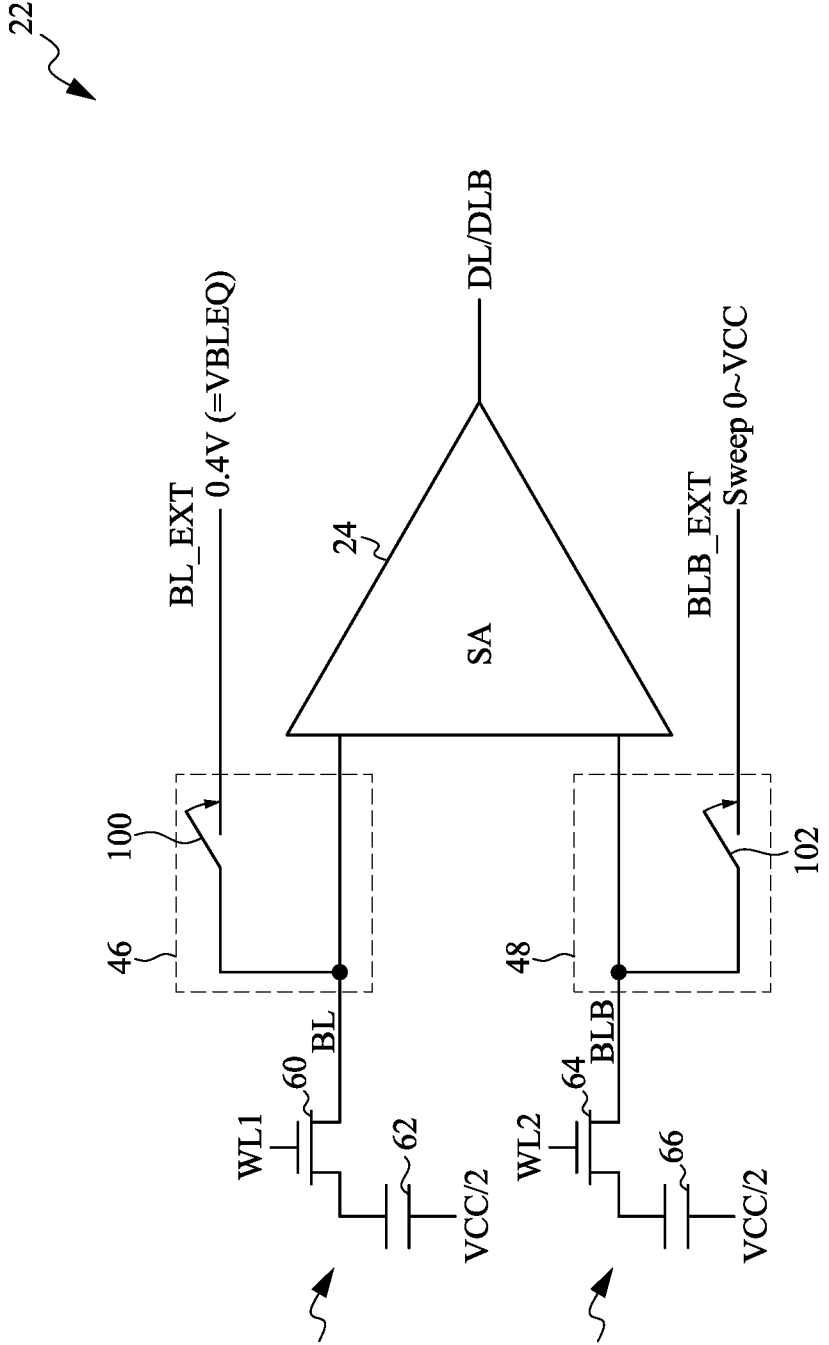
FIG. 7 is a diagram schematically illustrating the first memory cell, the second memory cell, and the sensing circuit configured to determine read sensing margins of the SA, in accordance with some embodiments.

FIG. 7 is a diagram schematically illustrating the first memory cell 50, the second memory cell 52, and the sensing circuit 22 configured to determine read sensing margins of the SA 24, in accordance with some embodiments. The first memory cell 50, the second memory cell 52, and the sensing circuit 22 are configured to determine a read 0 sensing margin and a read 1 sensing margin.

The first memory cell 50 is the 1T1C memory cell that includes the first NMOS access control transistor 60 and the first storage capacitor 62. The second memory cell 52 is the 1T1C memory cell that includes the second NMOS access control transistor 64 and the second storage capacitor 66. The gate of the first NMOS access control transistor 60 receives word line signal WL1, and the gate of the second NMOS access control transistor 64 receives word line signal WL2.

The first memory cell 50 is electrically connected to the first charging circuit 46 by the BL, and the second memory cell 52 is electrically connected to the second charging circuit 48 by the BLB. The first charging circuit 46 includes the first switch 100 connected at one end to the BL and at the other end to receive the external bit line voltage BL_EXT. The second charging circuit 48 includes the second switch 102 connected at one end to the BLB and at the other end to receive the external bit line bar voltage BLB_EXT.

To determine the read sensing margins of the SA 24, the external bit line voltage BL_EXT is set to the pre-charge voltage of VBLEQ, such as 0.4 volts, and the first switch 100 is closed to provide the pre-charge voltage of VBLEQ to the BL. The word line signal WL1 is set to a high voltage to bias on the first access control transistor 60 and provide the data voltage stored on the first storage capacitor 62 for a zero (0) or a one (1) to the BL. The word line signal WL2 is set to a low voltage to bias off the second access control transistor 64, which disconnects the second storage capacitor 66 from the BLB. Next, the second switch 102 is closed and the external bit line bar voltage BLB_EXT is swept from 0 volts to VCC. The SA 24 switches from a high output voltage DL and a low output voltage DLB to a low output voltage DL and a high output voltage DLB as the voltage on the BLB matches and sweeps higher than the voltage on the BL. In other embodiments, the external bit line bar voltage BLB_EXT can be swept from VCC to 0 volts.

To determine a read 0 sensing margin, the data voltage stored on the first storage capacitor 62 for a zero (0) is combined with the pre-charge voltage of VBLEQ, such as 0.4 volts, which reduces the voltage on the BL. As the voltage on the BLB matches the voltage on the BL, the SA 24 switches from a high output voltage DL and a low output voltage DLB to a low output voltage DL and a high output voltage DLB. The difference between this switching voltage and the pre-charge voltage of VBLEQ is the read 0 sensing margin.

To determine a read 1 sensing margin, the data voltage stored on the first storage capacitor 62 for a one (1) is combined with the pre-charge voltage of VBLEQ, such as 0.4 volts, which increases the voltage on the BL. As the voltage on the BLB matches the voltage on the BL, the SA 24 switches from a high output voltage DL and a low output voltage DLB to a low output voltage DL and a high output voltage DLB. The difference between this switching voltage and the pre-charge voltage of VBLEQ is the read 1 sensing margin.

Figure 8:
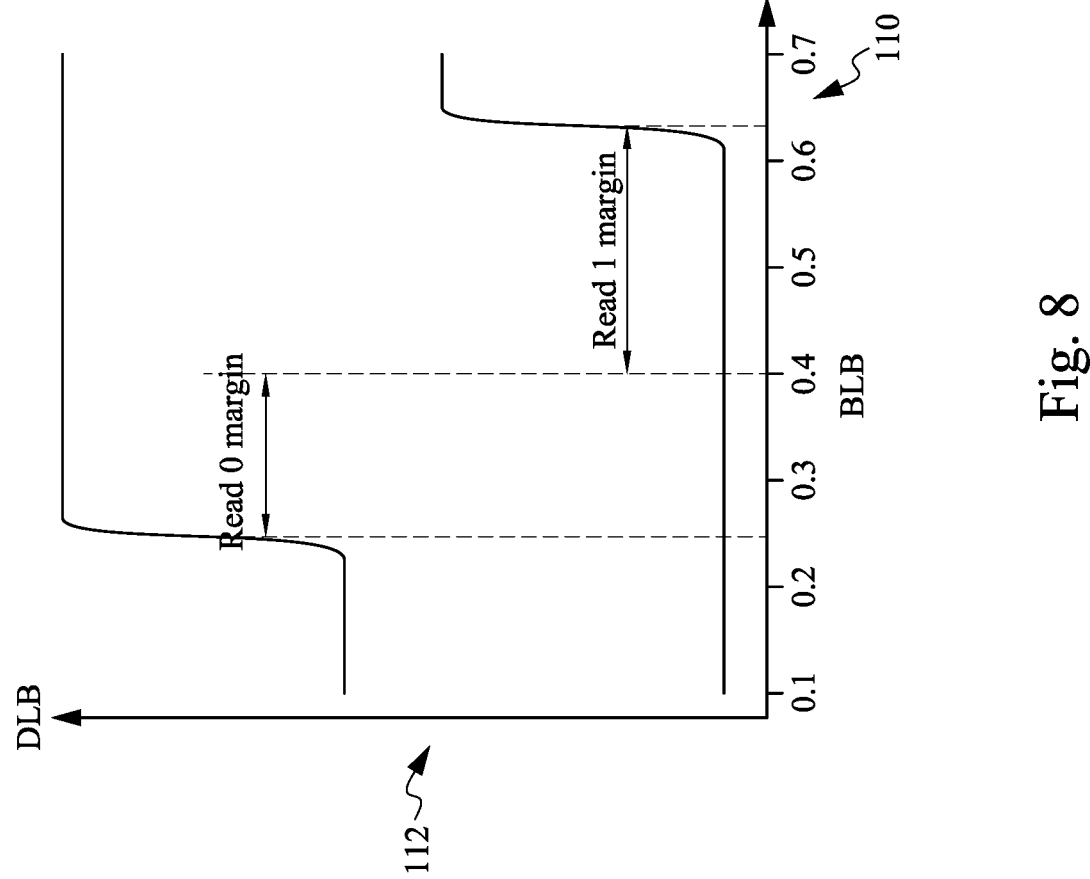
FIG. 8 is a diagram schematically illustrating the output voltage DLB versus the BLB voltage for determining the sensing margins of the SA in the sensing circuit of FIG. 7, in accordance with some embodiments.

FIG. 8 is a diagram schematically illustrating the output voltage DLB versus the BLB voltage for determining the sensing margins of the SA 24 in the sensing circuit 22 of FIG. 7, in accordance with some embodiments. The BLB voltage is on the x-axis 110 and the output voltage DLB is on the y-axis 112. In this example, the pre-charge voltage of VBLEQ is 0.4 volts and the BLB voltage is swept from 0.1 volts to 0.7 volts.

To determine a read 0 sensing margin, the data voltage stored on the first storage capacitor 62 for a zero (0) is combined with the pre-charge voltage of 0.4 volts to lower the voltage on the BL to about 0.25 volts. As the voltage on the BLB matches the voltage on the BL, the SA 24 switches from a low output voltage DLB to a high output voltage DLB. The difference between this switching voltage of about 0.25 volts and the pre-charge voltage of 0.4 volts is the read 0 sensing margin of about 0.15 volts.

To determine a read 1 sensing margin, the data voltage stored on the first storage capacitor 62 for a one (1) is combined with the pre-charge voltage of 0.4 volts to raise the voltage on the BL to about 0.625 volts. As the voltage on the BLB matches the voltage on the BL, the SA 24 switches from a low output voltage DLB to a high output voltage DLB. The difference between this switching voltage of about 0.625 volts and the pre-charge voltage of 0.4 volts is the read 1 sensing margin of about 0.225 volts.

Figure 9:
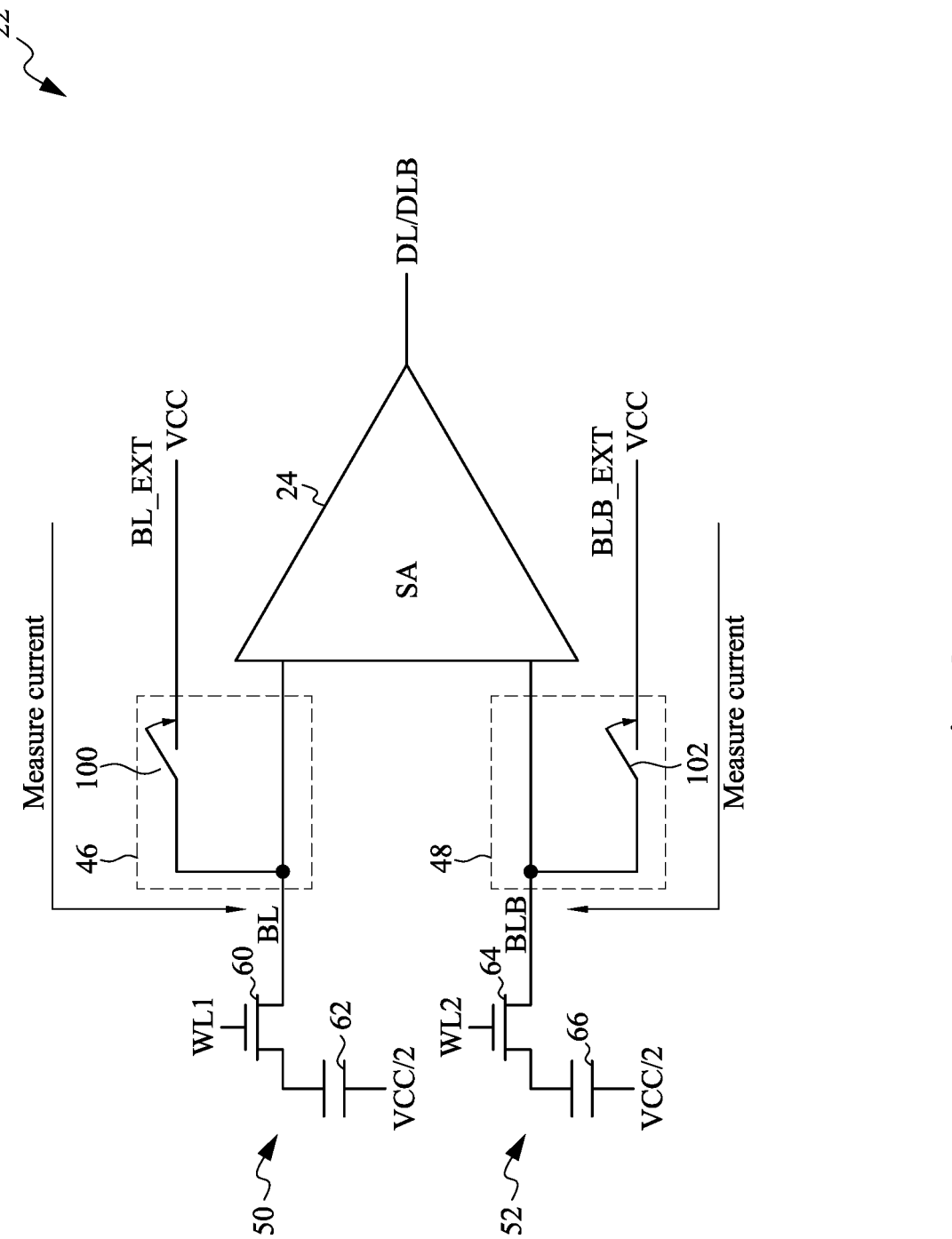
FIG. 9 is a diagram schematically illustrating the first memory cell, the second memory cell, and the sensing circuit configured to measure leakage currents of the BL and the BLB and to measure leakage currents of the first storage capacitor and the second storage capacitor, in accordance with some embodiments.

FIG. 9 is a diagram schematically illustrating the first memory cell 50, the second memory cell 52, and the sensing circuit 22 configured to measure leakage currents of the BL and the BLB and to measure leakage currents of the first storage capacitor 62 and the second storage capacitor 66, in accordance with some embodiments.

The first memory cell 50 is the 1T1C memory cell that includes the first NMOS access control transistor 60 and the first storage capacitor 62. The second memory cell 52 is the 1T1C memory cell that includes the second NMOS access control transistor 64 and the second storage capacitor 66. The gate of the first NMOS access control transistor 60 receives word line signal WL1, and the gate of the second NMOS access control transistor 64 receives word line signal WL2.

The first memory cell 50 is electrically connected to the first charging circuit 46 by the BL, and the second memory cell 52 is electrically connected to the second charging circuit 48 by the BLB. The first charging circuit 46 includes the first switch 100 connected at one end to the BL and at the other end to receive the external bit line voltage BL_EXT. The second charging circuit 48 includes the second switch 102 connected at one end to the BLB and at the other end to receive the external bit line bar voltage BLB_EXT.

To determine the leakage current of the BL, the word line signal WL1 is set to a low voltage to bias off the first access control transistor 60, which disconnects the first storage capacitor 62 from the BL. The external bit line voltage BL_EXT is set to a high voltage, such as VCC, and the first switch 100 is closed to provide the external bit line voltage BL_EXT to the BL. Then, the leakage current of the BL is measured.

To determine the leakage current of the BLB, the word line signal WL2 is set to a low voltage to bias off the second access control transistor 64, which disconnects the second storage capacitor 66 from the BLB. The external bit line bar voltage BLB_EXT is set to a high voltage, such as VCC, and the second switch 102 is closed to provide the external bit line bar voltage BLB_EXT to the BLB. Then, the leakage current of the BLB is measured.

To determine the leakage current of the first storage capacitor 62, the word line signal WL1 is set to a high voltage to bias on the first access control transistor 60, which connects the first storage capacitor 62 to the BL. The external bit line voltage BL_EXT is set to a high voltage, such as VCC, and the first switch 100 is closed to provide the external bit line voltage BL_EXT to the BL and the first storage capacitor 62. Then, the leakage current of the first storage capacitor 62 is measured.

To determine the leakage current of the second storage capacitor 66, the word line signal WL2 is set to a high voltage to bias on the second access control transistor 64, which connects the second storage capacitor 66 to the BLB. The external bit line bar voltage BLB_EXT is set to a high voltage, such as VCC, and the second switch 102 is closed to provide the external bit line bar voltage BLB_EXT to the BLB and the second storage capacitor 66. Then, the leakage current of the second storage capacitor 66 is measured.

Figure 10:
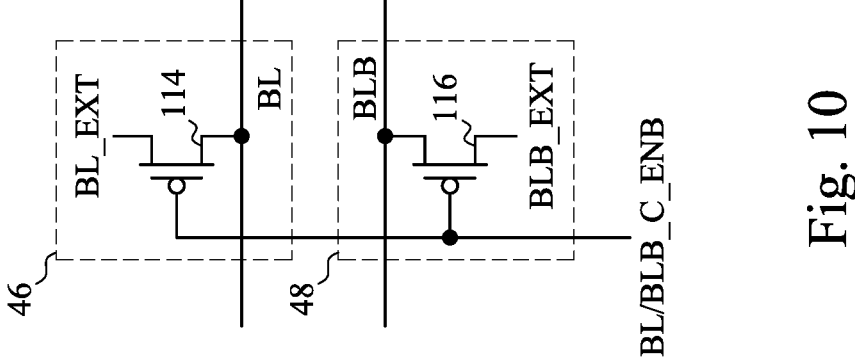
FIG. 10 is a diagram schematically illustrating first and second PMOS pass gate transistors in the first charging circuit and the second charging circuit, respectively, in accordance with some embodiments.

FIG. 10 is a diagram schematically illustrating first and second PMOS pass gate transistors 114 and 116 in the first charging circuit 46 and the second charging circuit 48, respectively, in accordance with some embodiments. In some embodiments, the sensing circuit 22 includes the first and second PMOS pass gate transistors 114 and 116, instead of the first and second NMOS pass gate transistors 68 and 70 (shown in FIG. 3).

The first charging circuit 46 includes the first PMOS pass gate transistor 114. One end of the drain/source path of the first PMOS pass gate transistor 114 receives external bit line voltage BL_EXT and the other end is electrically connected to the BL. The gate of the first PMOS pass gate transistor 114 receives a charge enable bar signal BL/BLB_C_ENB.

The second charging circuit 48 includes the second PMOS pass gate transistor 116. One end of the drain/source path of the second PMOS pass gate transistor 116 receives external bit line bar voltage BLB_EXT and the other end is electrically connected to the BLB. The gate of the second PMOS pass gate transistor 116 receives the charge enable bar signal BL/BLB_C_ENB. In other embodiments, the first charging circuit 46 and the second charging circuit 48 receive enable signals that are not the same.

Figure 11:
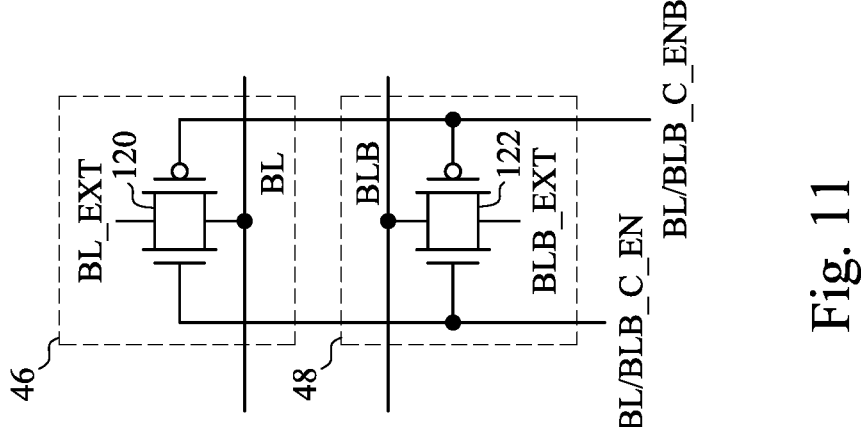
FIG. 11 is a diagram schematically illustrating first and second CMOS pass gates in the first charging circuit and the second charging circuit, respectively, in accordance with some embodiments.

FIG. 11 is a diagram schematically illustrating first and second CMOS pass gates 120 and 122 in the first charging circuit 46 and the second charging circuit 48, respectively, in accordance with some embodiments. In some embodiments, the sensing circuit 22 includes the first and second CMOS pass gates 120 and 122, instead of the first and second NMOS pass gate transistors 68 and 70 (shown in FIG. 3).

The first charging circuit 46 includes the first CMOS pass gate 120. One end of the first CMOS pass gate 120 receives external bit line voltage BL_EXT and the other end is electrically connected to the BL. The first CMOS pass gate 120 includes an NMOS input that receives a charge enable signal BL/BLB_C_EN and a PMOS input that receives a charge enable bar signal BL/BLB_C_ENB.

The second charging circuit 48 includes the second CMOS pass gate 122. One end of the second CMOS pass gate 122 receives external bit line bar voltage BLB_EXT and the other end is electrically connected to the BLB. The second CMOS pass gate 122 includes an NMOS input that receives the charge enable signal BL/BLB_C_EN and a PMOS input that receives the charge enable bar signal BL/BLB_C_ENB. In other embodiments, the first charging circuit 46 and the second charging circuit 48 receive enable signals that are not the same.

Figure 12:
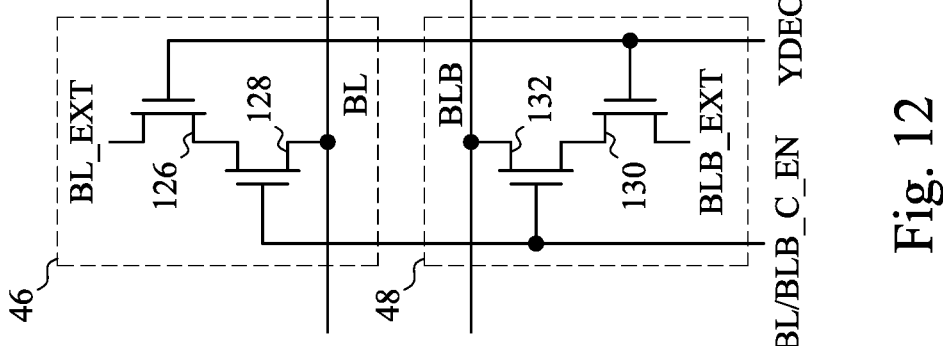
FIG. 12 is a diagram schematically illustrating additional Y decoded gating in the first charging circuit and in the second charging circuit, in accordance with some embodiments.

FIG. 12 is a diagram schematically illustrating additional Y decoded gating in the first charging circuit 46 and in the second charging circuit 48, in accordance with some embodiments. In some embodiments, the sensing circuit 22 includes the first and second charging circuits 46 and 48 with the additional Y decoded gating, instead of the first and second NMOS pass gate transistors 68 and 70 (shown in FIG. 3).

The first charging circuit 46 includes a first NMOS transistor 126 and a second NMOS transistor 128. One end of the drain/source path of the first NMOS transistor 126 receives external bit line voltage BL_EXT and the other end is electrically connected to one end of the drain/source path of the second NMOS transistor 128. The other end of the second NMOS transistor 128 is electrically connected to the BL. The gate of the first NMOS transistor 126 receives a Y decoded signal YDEC and the gate of the second NMOS transistor 128 receives a charge enable signal BL/BLB_C_EN.

The second charging circuit 48 includes a third NMOS transistor 130 and a fourth NMOS transistor 132. One end of the drain/source path of the third NMOS transistor 130 receives external bit line bar voltage BLB_EXT and the other end is electrically connected to one end of the drain/source path of the fourth NMOS transistor 132. The other end of the fourth NMOS transistor 132 is electrically connected to the BLB. The gate of the third NMOS transistor 130 receives the Y decoded signal YDEC and the gate of the fourth NMOS transistor 132 receives the charge enable signal BL/BLB_C_EN. In other embodiments, the first charging circuit 46 and the second charging circuit 48 receive enable signals that are not the same.

Figure 13:
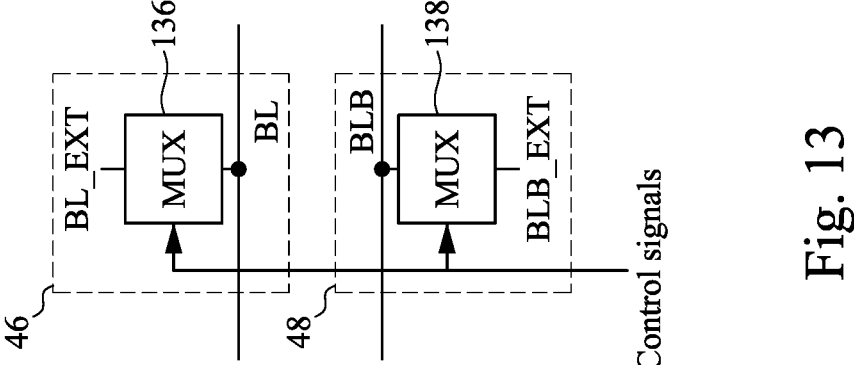
FIG. 13 is a diagram schematically illustrating first and second multiplexers in the first and second charging circuits, respectively, in accordance with some embodiments.

FIG. 13 is a diagram schematically illustrating first and second multiplexers 136 and 138 in the first and second charging circuits 46 and 48, respectively, in accordance with some embodiments. In some embodiments, the sensing circuit 22 includes the first and second multiplexers 136 and 138, instead of the first and second NMOS pass gate transistors 68 and 70 (shown in FIG. 3). In some embodiments, at least one of the first and second multiplexers 136 and 138 includes a combination of circuits including an NMOS pass gate, a PMOS pass gate, and/or a CMOS pass gate.

The first charging circuit 46 includes the first multiplexer 136. One side of the first multiplexer 136 receives external bit line voltage BL_EXT and the other side is electrically connected to the BL. The first multiplexer 136 receives control signals to control operation of the first multiplexer 136. The control signals include feature enable signals and/or partition select signals. The feature enable signals include mode enable signals, compute-in-memory (CIM) signals, machine learning signals, and artificial intelligence application signals. The partition select signals include different macro signals, different layer signals for a 3D array, X address decoded signals, and Y address decoded signals.

The second charging circuit 48 includes the second multiplexer 138. One side of the second multiplexer 138 receives external bit line bar voltage BLB_EXT and the other side is electrically connected to the BLB. The second multiplexer 138 receives control signals to control operation of the second multiplexer 138. The control signals include feature enable signals and/or partition select signals. The feature enable signals include mode enable signals, CIM signals, machine learning signals, and artificial intelligence application signals. The partition select signals include different macro signals, different layer signals for a 3D array, X address decoded signals, and Y address decoded signals. In other embodiments, the first charging circuit 46 and the second charging circuit 48 receive enable signals that are not the same.

FIG. 14 is a diagram schematically illustrating a method of operating a semiconductor device, such as the sensing circuit 22, in accordance with some embodiments.

At 150, the method includes receiving a first enable signal at a first circuit that is connected to a BL of a SA and, at 152, the method includes receiving a second enable signal at a second circuit that is connected to a BLB of the SA. In some embodiments, the first circuit is the first charging circuit 46 and the second circuit is the second charging circuit 48. In some embodiments, the SA is the SA 24. In some embodiments, the first enable signal and the second enable signal are the same signal. In some embodiments, the first enable signal and the second enable signal are not the same signal.

At 154, the method includes providing a first voltage from the first circuit to the BL in response to receiving the first enable signal and, at 156, the method includes providing a second voltage from the second circuit to the BLB in response to receiving the second enable signal.

In some embodiments, providing the first voltage and providing the second voltage includes providing one of the first voltage and the second voltage as a constant voltage and providing another one of the first voltage and the second voltage as a swept voltage from a low voltage to a high voltage and/or from a high voltage to a low voltage to switch states of the SA.

In some embodiments, the method includes enabling the first circuit and the second circuit; activating a first access control transistor that is connected to the BL and a first storage capacitor; providing a constant voltage in the first voltage to the BL; providing data voltage from the first storage capacitor to the BL; and sweeping the second voltage from a low voltage to a high voltage and/or from a high voltage to a low voltage to switch states of the SA.

In some embodiments, the method includes enabling the first circuit; de-activating a first access control transistor that is connected between the BL and a first storage capacitor; providing the first voltage that is a high voltage to the BL to measure leakage current of the BL. In some embodiments, the method includes enabling the first circuit; activating the first access control transistor that is connected between the BL and the first storage capacitor and providing the first voltage that is the high voltage to the BL to measure leakage current of the first storage capacitor.

Figure 15:
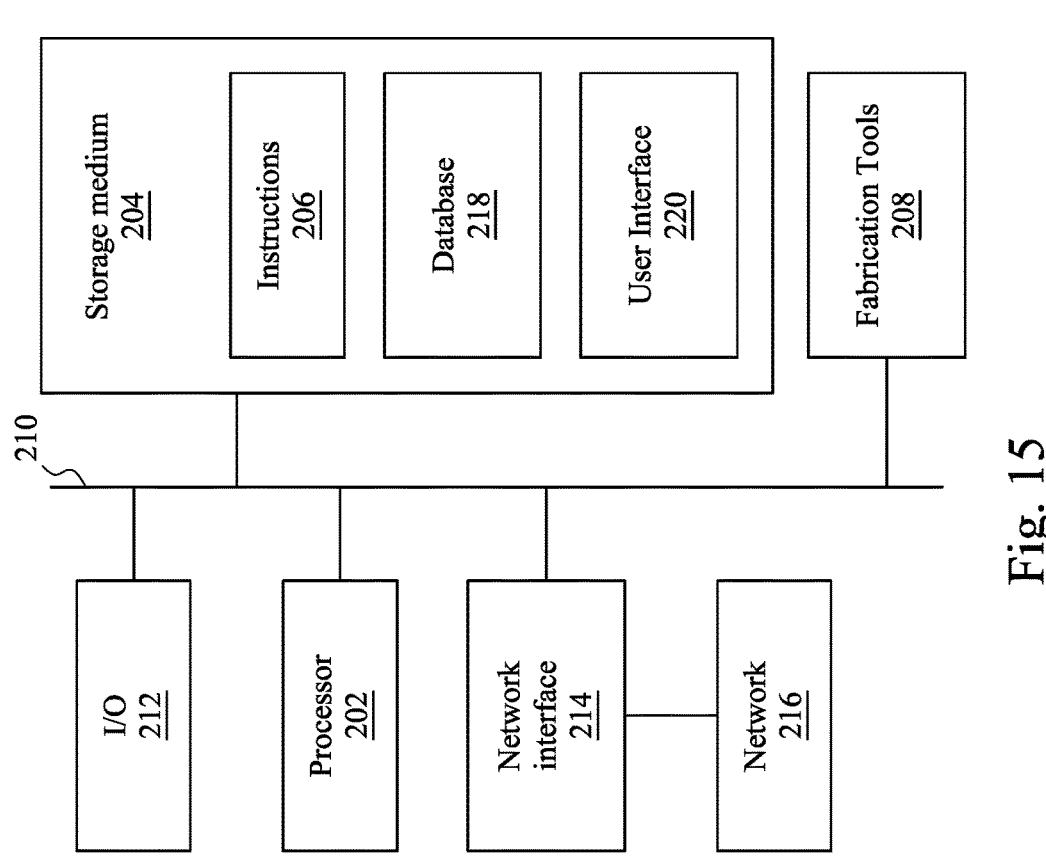
FIG. 15 is a block diagram schematically illustrating an example of a computer system configured to provide the semiconductor devices and methods of the current disclosure, in accordance with some embodiments.

FIG. 15 is a block diagram schematically illustrating an example of a computer system 200 configured to provide the semiconductor devices and methods of the current disclosure, in accordance with some embodiments. Some or all the design, layout, manufacture, testing, and operation of the semiconductor devices, also referred to as semiconductor circuits, can be performed by or with the computer system 200. In some embodiments, the computer system 200 includes an electronic design automation (EDA) system. In some embodiments, the semiconductor devices are ICs.

In some embodiments, the system 200 is a general-purpose computing device including a processor 202 and a non-transitory, computer-readable storage medium 204. The computer-readable storage medium 204 may be encoded with, e.g., store, computer program code such as executable instructions 206. Execution of the instructions 206 by the processor 202 provides (at least in part) a tool that implements a portion or all the functions of the system 200, such as pre-layout simulations, post-layout simulations, routing, rerouting, final layout, testing, and operation of the semiconductor devices. Further, fabrication tools 208 are included to further layout and physically implement the design and manufacture of the semiconductor devices. In some embodiments, execution of the instructions 206 by the processor 202 provides (at least in part) a tool that implements a portion or all the functions of the system 200. In some embodiments, the system 200 includes a commercial router. In some embodiments, the system 200 includes an automatic place and route (APR) system.

The processor 202 is electrically coupled to the computer-readable storage medium 204 by a bus 210 and to an I/O interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all the functions of the system 200, such as providing the semiconductor devices and methods of the current disclosure and other functions of the system 200. In some embodiments, the processor 202 is a central processing unit (CPU), a multi-processor, a distributed processing system, an application specific integrated circuit (ASIC), and/or a suitable processing unit.

In some embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 204 can include a compact disk read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all the functions of the system 200. In some embodiments, the computer-readable storage medium 204 also stores information which facilitates performing a portion or all the functions of the system 200. In some embodiments, the computer-readable storage medium 204 stores a database 218 that includes one or more of component libraries, digital circuit cell libraries, and databases.

The system 200 includes the I/O interface 212, which is coupled to external circuitry. In some embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of components and cells, and/or other parameters for processing by the processor 202. The information is transferred to the processor 202 by the bus 210. Also, the system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the system 200. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 200 include fabrication tools 208 for implementing the manufacturing processes of the system 200. For example, based on the final layout, photolithographic masks may be generated, which are used to fabricate the semiconductor device by the fabrication tools 208.

Figure 16:
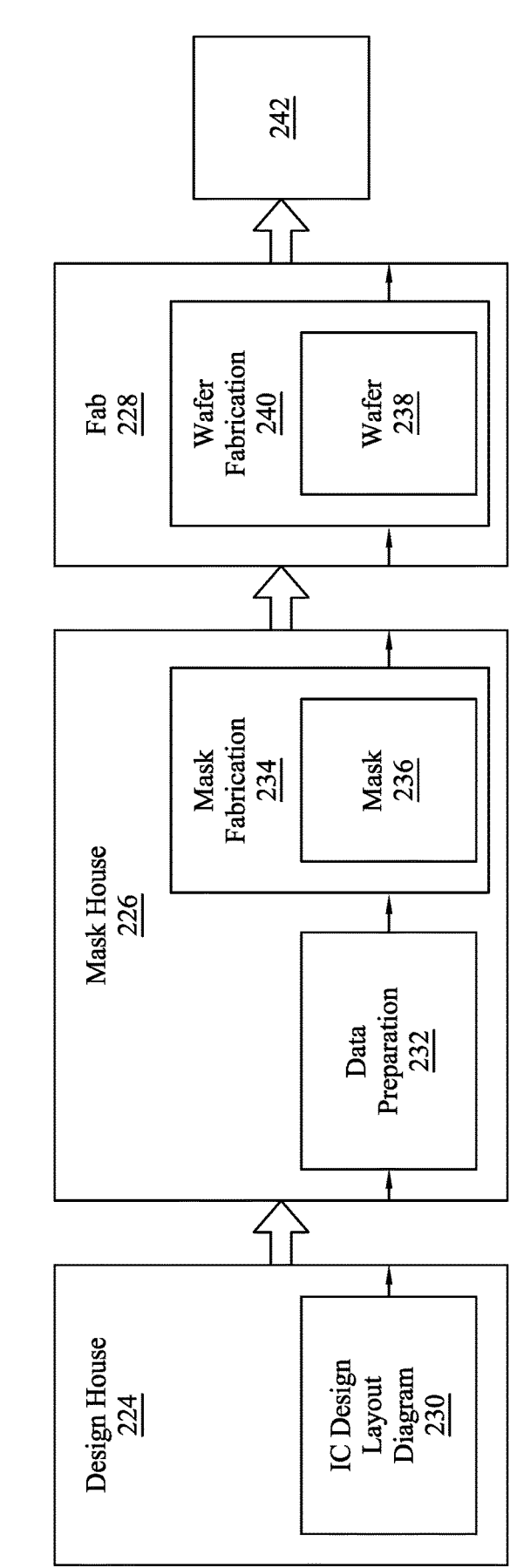
FIG. 16 is a block diagram of a semiconductor device manufacturing system and a semiconductor device manufacturing flow associated therewith, in accordance with some embodiments.

Further aspects of device fabrication are disclosed in conjunction with FIG. 16, which is a block diagram of a semiconductor device manufacturing system 222 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 222.

In FIG. 16, the semiconductor device manufacturing system 222 includes entities, such as a design house 224, a mask house 226, and a semiconductor device manufacturer/fabricator ("Fab") 228, that interact with one another in the design, development, and manufacturing cycles and/or services related to manufacturing a semiconductor device, such as the semiconductor devices described herein. The entities in the system 222 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 224, the mask house 226, and the semiconductor device fab 228 are owned by a single larger company. In some embodiments, two or more of the design house 224, the mask house 226, and the semiconductor device fab 228 coexist in a common facility and use common resources.

The design house (or design team) 224 generates a semiconductor device design layout diagram 230. The semiconductor device design layout diagram 230 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 230 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form a semiconductor device design layout diagram 230. The semiconductor device design layout diagram 230 is presented in one or more data files having information of the geometrical patterns. For example, semiconductor device design layout diagram 230 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 226 includes data preparation 232 and mask fabrication 234. The mask house 226 uses the semiconductor device design layout diagram 230 to manufacture one or more masks 236 to be used for fabricating the various layers of the semiconductor device or semiconductor structure. The mask house 226 performs mask data preparation 232, where the semiconductor device design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the semiconductor device fab 228. In FIG. 16, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the semiconductor device design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the semiconductor device design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the semiconductor device fab 228. LPC simulates this processing based on the semiconductor device design layout diagram 230 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the semiconductor device design layout diagram 230.

The above description of mask data preparation 232 has been simplified for the purposes of clarity. In some embodiments, data preparation 232 includes additional features such as a logic operation (LOP) to modify the semiconductor device design layout diagram 230 according to manufacturing rules. Additionally, the processes applied to the semiconductor device design layout diagram 230 during data preparation 232 may be executed in a variety of different orders.

After the mask data preparation 232 and during the mask fabrication 234, a mask 236 or a group of masks 236 are fabricated based on the modified semiconductor device design layout diagram 230. In some embodiments, the mask fabrication 234 includes performing one or more lithographic exposures based on the semiconductor device design layout diagram 230. In some embodiments, an electron-beam (e-beam) or a mechanism of multiple e-beams is used to form a pattern on a mask (photomask or reticle) 236 based on the modified semiconductor device design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The semiconductor device fab 228 includes wafer fabrication 240. The semiconductor device fab 228 is a semiconductor device fabrication business that includes one or more manufacturing facilities for the fabrication of a variety of different semiconductor device products. In some embodiments, the semiconductor device fab 228 is a semiconductor foundry. For example, there may be a manufacturing facility for the front end of line (FEOL) fabrication of a plurality of semiconductor device products, while a second manufacturing facility may provide the back end of line (BEOL) fabrication for the interconnection and packaging of the semiconductor device products, and a third manufacturing facility may provide other services for the foundry business.

The semiconductor device fab 228 uses the mask(s) 236 fabricated by the mask house 226 to fabricate the semiconductor structures or semiconductor devices 242 of the current disclosure. Thus, the semiconductor device fab 228 at least indirectly uses the semiconductor device design layout diagram 230 to fabricate the semiconductor structures or semiconductor devices 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the semiconductor device fab 228 using the mask(s) 236 to form the semiconductor structures or semiconductor devices 242 of the current disclosure. In some embodiments, the semiconductor device fabrication includes performing one or more lithographic exposures based at least indirectly on the semiconductor device design layout diagram 230.

Disclosed embodiments thus include semiconductor devices that include SAs having a BL and a BLB, a first charging circuit connected to the BL, and a second charging circuit connected to the BLB. The first charging circuit receives one or more enable signals and provides a first voltage to the BL and the second charging circuit receives one or more enable signals and provides a second voltage to the BLB. The first charging circuit and the second charging circuit provide different voltages, swept voltages, and measurement functions to the BL and the BLB.

Advantages of the semiconductor devices include testing functionality of the SA without using a memory cell; determining one or more offsets of the SA; determining one or more sensing margins of the SA; and measuring leakage currents of the BL, the BLB, and the storage nodes of the memory, such as the storage node capacitors.

In accordance with some embodiments, an integrated circuit includes a SA having input terminals connected to a BL and a BLB, a first memory cell configured to store a data signal and selectively output the data signal on at least one of the BL and the BLB in response to a word line signal, a first circuit connected between a first voltage terminal configured to receive a first external voltage and the BL and having a first enable terminal configured to receive a first enable signal, wherein the first external voltage is different than the data signal, and a second circuit connected between a second voltage terminal configured to receive a second external voltage and the BLB and having a second enable terminal configured to receive a second enable signal, wherein the second external voltage is different than the data signal and the first external voltage.

In accordance with further embodiments, a semiconductor device includes a SA, a memory cell array, a pre-charge and equalize circuit, a first circuit, and a second circuit. The SA is configured to be connected to a BL and a BLB. The memory cell array includes a plurality of memory cells, wherein a first memory cell has a first access control transistor connected to the BL and to a first storage capacitor and a second memory cell has a second access control transistor connected to the BLB and to a second storage capacitor. The pre-charge and equalize circuit is connected to the BL and the BLB and configured to provide an equalized pre-charge voltage to each of the BL and the BLB in response to an active pre-charge enable signal. The first circuit includes a first metal-oxide semiconductor field-effect transistor having a first drain/source terminal connected to the BL, a second drain/source terminal configured to receive a first external voltage, and a gate terminal configured to receive an enable signal, and the second circuit includes a second metal-oxide semiconductor field-effect transistor having a third drain/source terminal connected to the BLB, a fourth drain/source terminal configured to receive a second external voltage, and a gate terminal configured to receive the enable signal.

In accordance with still further disclosed aspects, a method of operating a semiconductor device includes receiving a first enable signal at a first circuit that is connected to a BL of a SA, receiving a second enable signal at a second circuit that is connected to a BLB of the SA, providing a first voltage from the first circuit to the BL in response to receiving the first enable signal, and providing a second voltage from the second circuit to the BLB in response to receiving the second enable signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a sense amplifier having input terminals connected to a bit line and a bit line bar;
a first memory cell configured to store a data signal and selectively output the data signal on at least one of the bit line and the bit line bar in response to a word line signal;
a first circuit connected between a first voltage terminal configured to receive a first external voltage and the bit line and having a first enable terminal configured to receive a first enable signal, wherein the first external voltage is different than the data signal;
a second circuit connected between a second voltage terminal configured to receive a second external voltage and the bit line bar and having a second enable terminal configured to receive a second enable signal, wherein the second external voltage is different than the data signal and the first external voltage; and
a memory cell array having a plurality of memory cells including the first memory cell, wherein the first memory cell is configured to be connected to the bit line and the second memory cell is configured to be connected to the bit line bar;
wherein the first memory cell includes a first access control transistor connected between the bit line and a first storage node and the second memory cell includes a second access control transistor connected between the bit line bar and a second storage node, the first circuit is configured to receive the first enable signal and provide the first external voltage to the bit line, and the first access control transistor is configured to receive the word line signal and provide the data signal from the first storage node to the bit line, and the second circuit is configured to receive the second enable signal and provide the second external voltage to the bit line bar, wherein the second external voltage is swept from a low voltage to a high voltage and/or from a high voltage to a low voltage to switch states of the sense amplifier.

2. The circuit of claim 1, wherein the first enable signal and the second enable signal are the same enable signal.

3. The circuit of claim 1, wherein the first circuit is configured to receive the first enable signal and provide the first external voltage that is a high voltage to the bit line and the first access control transistor is biased off to measure leakage current of the bit line and/or the second circuit is configured to receive the second enable signal and provide the second external voltage that is a high voltage to the bit line bar and the second access control transistor is biased off to measure leakage current of the bit line bar.

4. The circuit of claim 1, wherein the first circuit is configured to receive the first enable signal and provide the first external voltage that is a high voltage to the bit line and the first access control transistor is biased on to measure leakage current of the first storage node and/or the second circuit is configured to receive the second enable signal and provide the second external voltage that is a high voltage to the bit line bar and the second access control transistor is biased on to measure leakage current of the second storage node.

5. The circuit of claim 1, wherein the first external voltage is an equalized pre-charge voltage and the second external voltage is swept from the low voltage to the high voltage and/or from the high voltage to the low voltage to switch states of the sense amplifier.

6. The circuit of claim 1, comprising a pre-charge and equalize circuit connected to the bit line and the bit line bar and configured to provide an equalized voltage to each of the bit line and the bit line bar in response to an active pre-charge enable signal.

7. The circuit of claim 1, wherein at least one of the first circuit and the second circuit is an n type pass gate, a p type pass gate, a CMOS pass gate, a multiplexer, or includes Y decoder gating.

8. The circuit of claim 1, wherein the first circuit includes a metal-oxide semiconductor field-effect transistor having a first drain/source terminal connected to the bit line, a second drain/source terminal configured to receive the first external voltage, and a gate terminal configured to receive the first enable signal.

9. The circuit of claim 8, wherein the metal-oxide semiconductor field-effect transistor is an n-channel metal-oxide semiconductor field-effect transistor.

10. The circuit of claim 1, wherein the second circuit includes a metal-oxide semiconductor field-effect transistor having a first drain/source terminal connected to the bit line bar, a second drain/source terminal configured to receive the second external voltage, and a gate terminal configured to receive the second enable signal.

11. A semiconductor device, comprising:
a sense amplifier configured to be connected to a bit line and a bit line bar;
a memory cell array including a plurality of memory cells, wherein a first memory cell has a first access control transistor connected to the bit line and to a first storage capacitor and a second memory cell has a second access control transistor connected to the bit line bar and to a second storage capacitor;
a pre-charge and equalize circuit connected to the bit line and the bit line bar and configured to provide an equalized pre-charge voltage to each of the bit line and the bit line bar in response to an active pre-charge enable signal;
a first circuit that includes a first metal-oxide semiconductor field-effect transistor having a first drain/source terminal connected to the bit line, a second drain/source terminal configured to receive a first external voltage, and a gate terminal configured to receive an enable signal; and
a second circuit that includes a second metal-oxide semiconductor field-effect transistor having a third drain/source terminal connected to the bit line bar, a fourth drain/source terminal configured to receive a second external voltage, and a gate terminal configured to receive the enable signal,
wherein the second drain/source terminal or the first metal-oxide semiconductor field-effect transistor is connected to a fifth metal-oxide semiconductor field-effect transistor configured to receive the first external voltage and the fourth drain/source terminal of the second metal-oxide semiconductor field-effect transistor is connected to a sixth metal-oxide semiconductor field-effect transistor is connected to a sixth external voltage.

12. The device of claim 11, wherein each of the first metal-oxide semiconductor field-effect transistor and the second metal-oxide semiconductor field-effect transistor is an n-channel metal-oxide semiconductor field-effect transistor.

13. The device of claim 11, wherein each of the first metal-oxide semiconductor field-effect transistor and the second metal-oxide semiconductor field-effect transistor is a p-channel metal-oxide semiconductor field-effect transistor.

14. The device of claim 11, wherein the first metal-oxide semiconductor field-effect transistor is part of a first complementary metal-oxides semiconductor pass gate and the second metal-oxide semiconductor field-effect transistor is part of a second complementary metal-oxides semiconductor pass gate.

15. The device of claim 11, wherein each of the fifth metal-oxide semiconductor field-effect transistor and the sixth metal-oxide semiconductor field-effect transistor is an n-channel metal-oxide semiconductor field-effect transistor.

16. A method of operating a semiconductor device, the method comprising:

receiving a first enable signal at a first circuit that is connected to a bit line of a sense amplifier;

receiving a second enable signal at a second circuit that is connected to a bit line bar of the sense amplifier;

providing a first voltage from the first circuit to the bit line in response to receiving the first enable signal; and providing a second voltage from the second circuit to the bit line bar in response to receiving the second enable signal, wherein providing a first voltage and providing a second voltage includes providing one of the first voltage and the second voltage as a constant voltage and providing another one of the first voltage and the second voltage as a swept voltage from a low voltage to a high voltage and/or from a high voltage to a low voltage to switch states of the sense amplifier.

17. The method of claim 16, wherein the first enable signal and the second enable signal are the same signal.

18. The method of claim 16, comprising:

enabling the first circuit and the second circuit;

activating an access control transistor that is connected to the bit line and a West-storage capacitor;

providing a constant voltage in the first voltage to the bit line;

providing data voltage from the storage capacitor to the bit line; and sweeping the second voltage from a low voltage to a high voltage and/or from a high voltage to a low voltage to switch states of the sense amplifier.

19. The method of claim 16, comprising:

enabling the first circuit;

de-activating an access control transistor that is connected between the bit line and a storage capacitor; and providing the first voltage that is a high voltage to the bit line to measure leakage current of the bit line.

20. The method of claim 16, comprising:

enabling the first circuit;

activating an access control transistor that is connected between the bit line and a storage capacitor; and providing the first voltage that is a high voltage to the bit line to measure leakage current of the storage capacitor.

* * * * *